United States Patent
Watanabe (12)

(10) Patent No.: US 6,646,582 B2
(45) Date of Patent: Nov. 11, 2003

(54) ERROR COMPENSATION FOR SIGMA-DELTA MODULATED DIGITAL SIGNALS OR THE LIKE

(75) Inventor: Kazuo Watanabe, Iruma (JP)

(73) Assignee: TEAC Corporation (JP)

( * ) Notice: Subject to any disclaimer, the term of this patent is extended or adjusted under 35 U.S.C. 154(b) by 0 days.

(21) Appl. No.: 10/215,624

(22) Filed: Aug. 9, 2002

(65) Prior Publication Data

US 2003/0030577 A1 Feb. 13, 2003

(30) Foreign Application Priority Data

Aug. 10, 2001 (JP) ........................................ 2001-244735

(51) Int. Cl.[7] ............................................... H03M 3/00
(52) U.S. Cl. ........................ 341/143; 341/155; 341/120
(58) Field of Search ................................. 341/143, 155, 341/120

(56) References Cited

U.S. PATENT DOCUMENTS 5,014,274 A * 5/1991 Higurashi et al. .......... 714/768
5,774,481 A * 6/1998 Meaney et al. ............. 714/763
5,936,561 A * 8/1999 Lee .............................. 341/143

FOREIGN PATENT DOCUMENTS

JP            00/114971            4/2000

* cited by examiner

Primary Examiner—Peguy JeanPierre
(74) Attorney, Agent, or Firm—Woodcock Washburn LLP

(57) ABSTRACT

A noise control system for use in an SACD player in order to compensate for errors in the recovered delta-sigma modulated audio signal in which each sample of the original analog signal is expressed by either binary 0 or 1. Included is an error-detecting and -correcting circuit for detecting and, if possible, correcting errors in the primary data of the digital signal. An interpolation data generator is provided which repeatedly puts out a predefined interpolation datum for insertion in each uncorrectable or uncorrected error location in the digital signal whenever such an error is detected by the error-detecting and -correcting circuit. The interpolation datum is constituted of equal numbers of binary 0s and 1s, which are so arranged as to represent a frequency in excess of the audible range of frequencies.

6 Claims, 4 Drawing Sheets

ERROR COMPENSATION FOR SIGMA-DELTA MODULATED DIGITAL SIGNALS OR THE LIKE

BACKGROUND OF THE INVENTION

This invention relates generally to the error control or management of digital signals as in the playback of digitized audio signals, and pertains more specifically to a method of, and means for, compensating for uncorrectable or uncorrected errors in sigma-delta-modulated audio signals or the like in which each sample of the original analog signal is expressed by one bit of digital data, that is, by either a binary 0 or 1.

The so-called "super audio compact disk," with its greatly extended range of frequencies compared to that of the more conventional compact disk, has recently been developed by Sony and Philips and introduced to the market the world over. Recorded on the SACD is what is known as the "direct stream digital" (DSD) signal. The DSD is essentially equivalent to delta-sigma (or sigma-delta) modulation, in which each sample of the analog audio signal is translated into either of the binary digits 0 and 1, as will be later explained in more detail. Japanese Unexamined Patent Publication No. 2000-114971 is hereby cited as dealing with sigma-delta modulation.

Whereas each sample of the audio signal is translated into a plurality of, sixteen for example, bits in the more conventional pulse-code modulation, the delta-sigma modulation employs but either of the binary digits 0 and 1 for expressing each sample of the analog signal. Let it be assumed that a stream of audio signal is now both delta-sigma and pulse-code modulated into digital signals that are the same in the total number of bits. Then the sampling frequency of delta-sigma modulation can be made very much, sixteen times for example, higher than that of pulse-code modulation. A higher-resolution analog-to-digital conversion is therefore possible by delta-sigma modulation without an increase in the total number of bits for a given signal volume.

Read errors are, however, almost unavoidable in the playback of the delta-sigma modulated SACD as in that of the regular CD but, again as with the regular CD, detectable by error-detecting codes such as the familiar cyclic redundancy checks. Error-correcting codes are also available for correcting any errors that are correctable, in delta-sigma modulated data. Uncorrectable errors have been circumvented. As far as the applicant is aware, the only known solution for such errors in the SACD has been to cause the analog output signal to fade out immediately before each error location and to fade in just afterward.

In the case of pulse-code modulated data, the datum missing from an uncorrectable error location is estimated to be the same as the preceding datum, and this preceding datum is interpolated in the error location. It might be contemplated to apply this interpolation method to delta-sigma modulated audio signals. This remedy is totally unacceptable, as it would give rise to audible noise instead of the fading method discussed above. For, in delta-sigma modulation, the logical 0 or 1 immediately before the error does not reflect the amplitude of the analog signal recorded. The trouble would occur if the datum before the error was 1. Should the uncorrectable error datum be estimated to be 1 on the basis of this preceding datum, the result might be the production of a formidable noise. More will be said later about this noise production with reference to the attached drawings.

SUMMARY OF THE INVENTION

The present invention seeks to compensate, by interpolation and without fading, for read or transmission errors that occur as in the play-back of delta-sigma or like pulse-density modulated data, just as noiselessly as the familiar error compensation of pulse-code modulated data by interpolation.

Briefly, the present invention may be summarized as a noise control system for use on a transmission path for a digital signal that is constituted of primary data in which each sample of an analog signal is expressed by one bit of information, and of error correction data for use in correction of error in the primary data. The noise control system comprises an error-detecting and -correcting circuit for detecting and, if possible, correcting errors in the primary data of the digital signal with use of the error correction data. The error-detecting and -correcting circuit has a first output for delivery of the digital signal, and a second output for production of an uncorrectable error signal indicative of the presence or absence of an uncorrectable or uncorrected error in or from the digital signal. Also included is an interpolation data generator for generating a predefined interpolation datum for insertion in each uncorrectable or uncorrected error location in the digital signal. An interpolation circuit is connected to both the error-detecting and -correcting circuit and the interpolation data generator for inserting, when the uncorrectable error signal from the second output of the error-detecting and -correcting circuit indicates the presence of an uncorrectable or uncorrected error, the predefined interpolation datum in the location of the uncorrectable or uncorrected error in the digital signal issuing from the first output of the error-detecting and -correcting circuit.

The invention further specifies that the interpolation datum for insertion in each uncorrectable or uncorrected error location be constituted of a plurality of binary 0s and a plurality of binary 1s, and that the 0s and 1s in each interpolation datum be equal in number. Furthermore, the 0s and 1s in each interpolation datum should be so arranged as to represent a frequency higher than the upper limit of audio frequencies, which commonly is believed to be 20 kilohertz. An example of interpolation datum meeting all these requirements is [1010] or an integral multiple thereof.

When the digital signal with an uncorrectable or uncorrected error compensated for by the teachings of the invention is subsequently converted into an analog signal, the analog equivalent of the interpolation datum maintains on the average the signal value preceding the error location. Any uncorrectable or uncorrected errors in delta-sigma or like pulse-density modulated signals can be compensated for by the method of this invention in essentially the same way as errors in pulse-code modulated signals are conventionally compensated for by interpolation of the preceding values. This remedy is obviously more agreeable to the ear than the conventional fading and certainly far less obnoxious than the interpolation of previous values.

The above and other objects, features and advantages of this invention will become more apparent, and the invention itself will best be understood, from a study of the following detailed description and appended claims, with reference had to the attached drawings showing a preferred embodiment of the invention together with the associated prior art.

DETAILED DESCRIPTION

Figure 1:
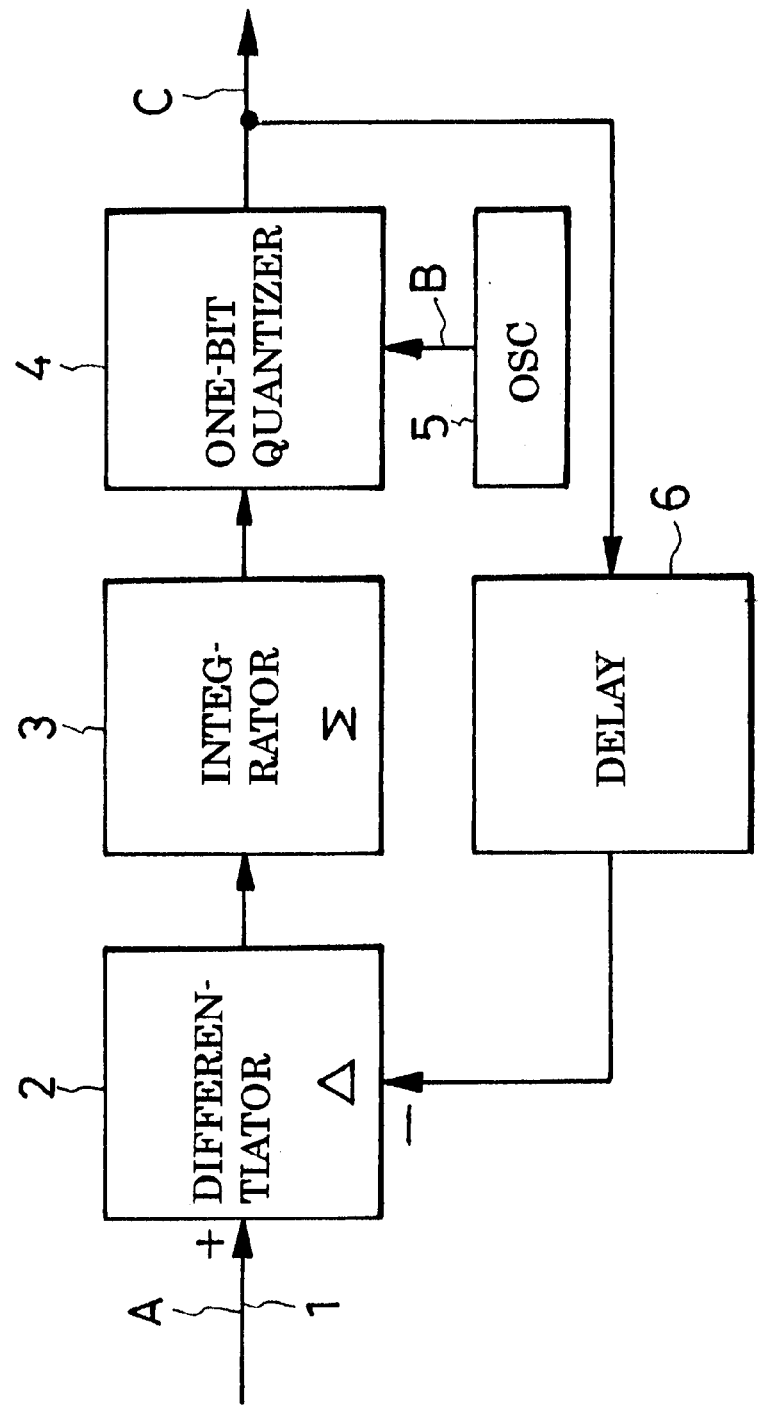
FIG. 1 is a block diagram of the prior art delta-sigma modulator circuit used for digitizing analog audio signals.

It is considered essential for a better understanding of the present invention that the prior art delta-sigma modulator be shown and explained in some more detail. With reference to FIG. 1 the known modulator is such that the analog input line 1 is connected to a differentiator 2, thence to an integrator 3, and thence to a one-bit quantizer 4. A bit clock 5 is also connected to the quantizer 4. The output of the quantizer 4 is connected via a delay circuit 6 to the differentiator 2 thereby forming a negative feedback loop.

Figure 2:
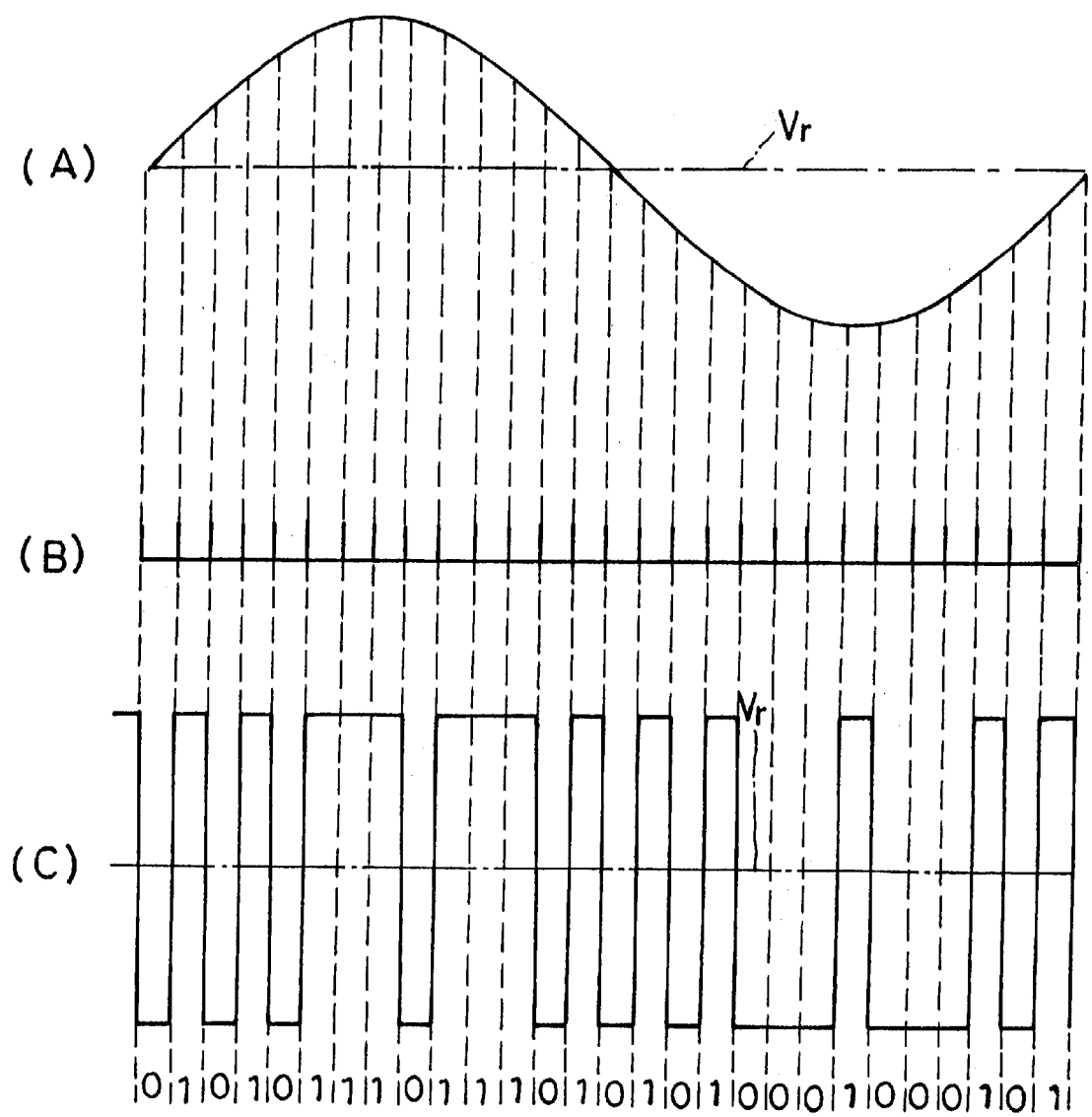
FIG. 2, consisting of (A) through (C), is a diagram of waveforms appearing in various parts of the FIG. 1 circuit, the waveform diagram being explanatory of how the analog audio signal is digitized, with each sample of the audio signal expressed by a binary 0 or 1.

At (A) in FIG. 2 is shown the analog input signal fed into this modulator over the line 1, and at (B) the bit clock pulses delivered from clock 5 to quantizer 4. The resulting binary digital output from the quantizer 4, seen at (C) in FIG. 2, is fed back to the differentiator 3 after being delayed by one sampling interval by the delay circuit 6. The differentiator 3 puts out a signal indicative of the result of subtraction of the delay circuit output signal from the FIG. 2(A) analog input signal. Inputting this differentiator output signal, the integrator 3 provides an output waveform as the time integral of the input waveform.

Clocked by the FIG. 2(B) pulses from the clock 5, the one-bit quantizer 4 quantizes the output from the integrator 3 as at (C) in FIG. 2. In principle the quantizer 4 puts out a logical 1 during the positive half-cycles of the analog input signal, in which the signal magnitude is greater than the reference level $V_r$, FIG. 2(A), and a logical 0 during the negative half-cycles of the input signal. However, in the FIG. 1 modulator including the differentiator 2, integrator 3, and negative feedback loop including the delay circuit 6, the quantizer output takes the form of a pulse train, containing both 1s and 0s during both positive and negative half-cycles of the analog signal.

As is clear from a comparison of the analog input signal at (A) in FIG. 2 and its digital equivalent at (C) in the same figure, the digital signal increases in the density of 1s with a rise in the voltage of the analog signal, and in the density of 0s with a drop in the voltage of the analog signal. The delta-sigma modulation may therefore be thought of as "pulse density modulation," in which the analog signal has its voltage expressed in terms of pulses per unit length of time.

Whereas each sample of the audio signal is translated into a plurality of, sixteen for example, bits in the conventional pulse-code modulation, the delta-sigma modulation employs but either of the binary digits 0 and 1 for expressing each sample of the analog signal. Let it be assumed that a stream of audio signal is now both delta-sigma and pulse-code modulated into digital signals that are the same in the total number of bits. Then the sampling frequency of delta-sigma modulation can be made very much (e.g. sixteen times) higher than that of pulse-code modulation. A higher-resolution analog-to-digital conversion is therefore possible by delta-sigma modulation without an increase in the total number of bits for a given signal volume.

Figure 3:
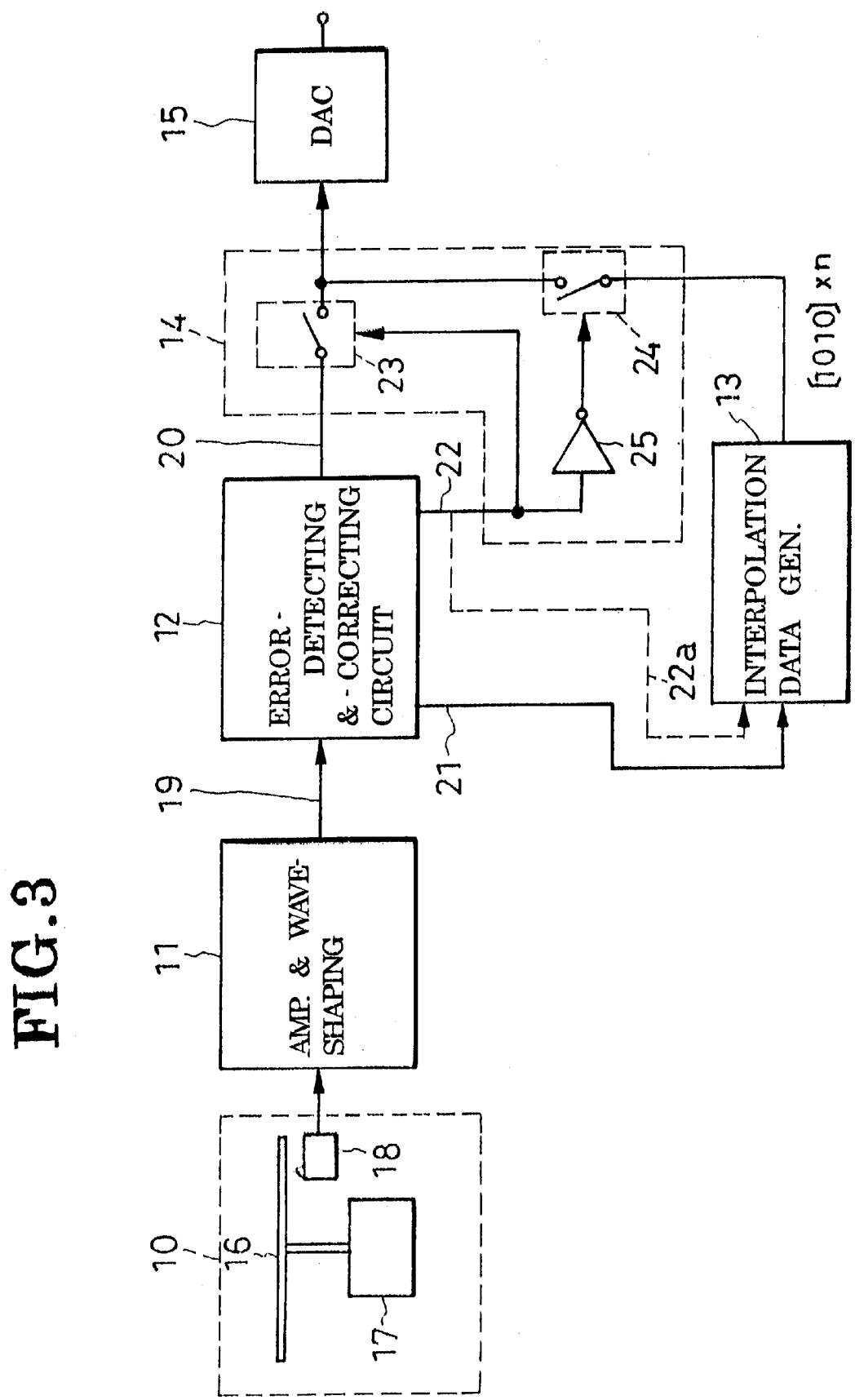
FIG. 3 is a block diagram of an optical disk player incorporating the noise control system according to the invention.

FIG. 3 is an illustration of the digital audio player incorporating the error control system according to the invention. Included is an optical data recovery device 10 having an optical pickup 18 for data recovery from an optical data storage disk 16 such as an SACD, which is driven by a disk drive motor 17. It is understood that the pickup 18 is conventionally relatively movable across the data tracks on the disk 16 for tracing the tracks with the rotation of the disk. The pickup 18 itself can also be of conventional design, irradiating the disk surface with a laser beam and reading the recorded data from the data-modulated beam reflection from the disk surface. The data thus read on the disk 16 is put out as an electric signal from the pickup 18.

Figure 4:
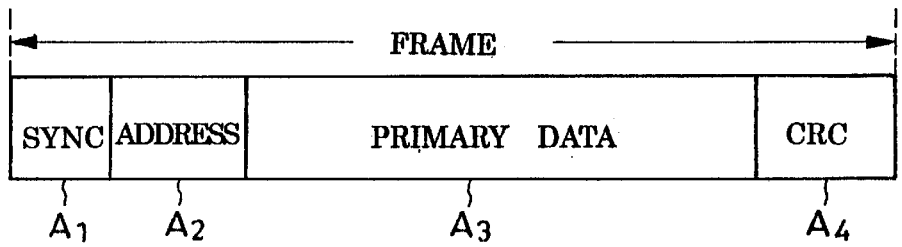
FIG. 4 is a schematic diagram of an example of known format by which the delta-sigma modulated digital is recorded on the optical disk played by the FIG. 3 device.

It is further understood that the data to be played back from the disk 16 is conventionally prerecorded thereon in delta-sigma modulated form. Such data will be hereinafter referred to as the primary data in contradistinction from other prerecorded data to be set forth hereinafter. FIG. 4 indicates by way of reference how the data tracks on the disk 16 are conventionally formatted. Each frame is constituted of a synchronization section $A_1$, an address section $A_2$, a main section $A_3$, and an error correction section $A_4$. The synchronization section $A_1$ contains synchronization data for this frame. The address section $A_2$ contains address data uniquely identifying the main data recorded on the main section $A_3$ of this frame. The main section $A_3$ has prerecorded thereon the noted primary data in the form of the delta-sigma modulation, explained with reference to FIGS. 1 and 2, of the analog audio signal to be played back. The error correction section $A_4$ contains data needed for cyclic redundancy checks of the primary data. Other error correction codes could be employed, however, such as what is referred to as the Cross Interleave Read Solomon Code in the art.

Produced by the prior art delta-sigma modulator of FIG. 1, the primary data is recorded frame by frame along the data tracks on the disk 16. The primary data may be conventionally interleaved while being so recorded on the disk.

With reference back to FIG. 3 the optical pickup 18 delivers its electric data output to an amplifying and wave-shaping circuit 11 and thence, over a transmission path 19, to an error-detecting and -correcting circuit 12. Itself a standard component of the commercial CD player, the error-detecting and -correcting circuit 12 is conventionally equipped to perform the three principal functions of: (1) detecting errors in the primary data journeying over the transmission path 19; (2) correcting errors, upon detection thereof, by the cyclic redundancy checks; and (3) determining whether the errors have been correctable or not. The primary data together with the corrected or uncorrected errors is delivered to the next processing stage over an output line 20 of this circuit 12. The error-detecting and -correcting circuit 12 has a second output line 21 for delivery of an "error" signal indicative of whether an error has been detected in the primary data or not, and a third output line 22 for delivery of an "uncorrectable" signal indicative of each uncorrectable or uncorrected error in the primary data.

The second output line 21 of the error-detecting and -correcting circuit 12 is connected to an interpolation data generator 13 constituting a feature of this invention. Each time the incoming "error" signal indicates the presence of an error in the recovered delta-sigma modulated audio signal, the interpolation data generator 13 puts out a binary datum for interpolation in place of the detected error, provided that this error has proved uncorrectable or has been uncorrected in the error-detecting and -correcting circuit 12.

The interpolation datum that can be employed in the practice of the invention consists either of a prescribed minimal number of bits, four for example, or of an integral multiple of thereof. A preferable example of interpolation datum with the minimal number of bits is [1010], so that either this four-bit datum or an integral multiple thereof is to be inserted in each uncorrectable or uncorrected error location of the digital signal in a manner yet to be described. In conventionally interleaving the primary data in the practice of the invention, the number of bits to be interleaved may be made equal to the minimal bit number of the interpolation datum according to the invention or to an integral multiple thereof. Interleaving of the primary data is generally preferred by virtue of noise dispersion and, in consequence, less conspicuous noise production.

Speaking more broadly, the interpolation data employable for error compensation according to the present invention must meet the following conditions:

1. Each interpolation datum contain a plurality of 0s and a plurality of 1s.
2. The 0s and 1s of each interpolation datum be equal in number to each other.
3. An analog equivalent of each interpolation datum represent a frequency in excess of the audible range of frequencies; that is, the repetition frequencies of 0s and 1s, or of two or more consecutive 0s and two or more consecutive 1s, be higher than the audible frequency range or 20 kHz.

The possible examples of interpolation data fulfilling all the fore-going requirements are, in the case of four-bit data, [0101], [1100], [0011], [0110] and [1001], in addition to [1010] set forth above. The interpolation data generator 13 puts out a preselected one of such interpolation data in bit-by-bit synchronism with the primary data on the output line 20 of the error-detecting and -correcting circuit 12.

The primary data from the error-detecting and -correcting circuit 12 and the interpolation data from the interpolation data generator 13 are both directed into an interpolation circuit 14 before being fed into a digital-to-analog converter 15. The interpolation data are inserted in the uncorrectable error locations of the primary data by the interposition circuit 14 before the primary data are converted into an analog signal by the DAC 15.

Constituting another feature of the invention, the interpolation circuit 14 comprises a primary data switch 23, an interpolation data switch 24, and a NOT circuit 25. The primary data switch 23 is connected between error-detecting and -correcting circuit 12 and DAT 15 and is to be turned on and off by the "uncorrectable" signal sent from the circuit 12 over the line 22. The primary data switch 23 is to remain closed, permitting delivery of the primary data from error-detecting and -correcting circuit 12 to DAC 15, as long as the "uncorrectable" signal indicates the absence of any uncorrectable or uncorrected error. When the "uncorrectable" signal indicates the presence of an uncorrectable or uncorrected error, on the other hand, the primary data switch 23 is to open for interruption of the primary data.

The interpolation data switch 24 is connected between interpolation data generator 13 and DAC 15 for on-off operation in inverse relationship to the primary data switch 23. For such inverse switching operation the "uncorrectable" signal from the error-detecting and -correcting circuit 12 is applied to the control input of the interpolation data switch 24 after being inverted by a NOT circuit 25. Thus, when the "uncorrectable" signal is low, for example, indicating the presence of an uncorrectable or uncorrected error, the interpolation data switch 24 will be closed for delivery of the associated interpolation datum to the DAC 15 in place of the missing part of the primary data from the data-detecting and -correcting circuit 12.

Figure 5:
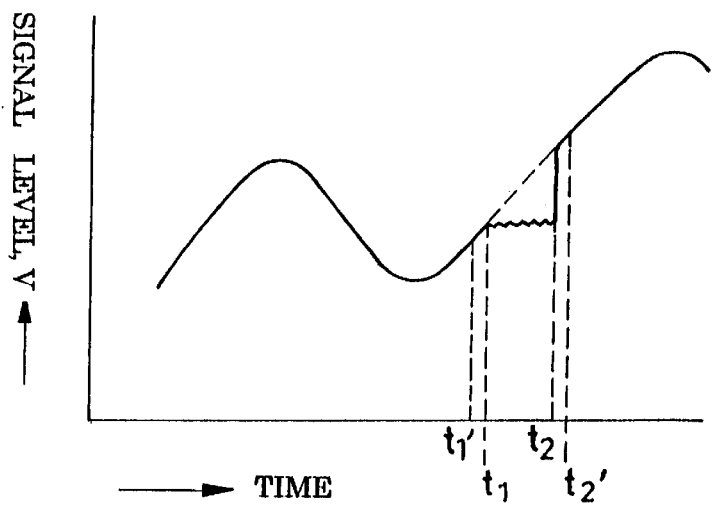
FIG. 5 is a waveform diagram of an analog equivalent of the digital signal with an error compensated for by the FIG. 3 noise control system.

Plotted in FIG. 5 is the output waveform of the DAC 15 in which an uncorrected or uncorrectable error has been compensated for by noise-free interpolation according to the invention. The error occurred from $t_1$ to $t_2$. The length of time during which the primary data switch 23 is held off, and the interpolation data switch 24 held on, is set equal to the duration of the minimal unit of interpolation data, that is, four bits, or to that of an integral multiple thereof. Consequently, the nonconducting period of the primary data switch 23, and the conducting period of the interpolation data switch 24, may not necessarily be equal to the duration $t_1-t_2$ of the error but may start earlier than $t_1$, as at $t_1'$, and end later than $t_2$, as at $t_2'$. It is understood that both error-detecting and -correcting circuit 12 and interpolation data generator 13 are furnished with memories, not shown, for error detection and correction and for timing the deliveries of the primary and the interpolation data.

The DAC 15 can be of prior art design including a low-pass filter and other means for translating the incoming delta-sigma modulated audio signal into an analog signal. Additional circuit means may be conventionally connected for signal processing between interpolation circuit 14 and DAC 15. Issuing from the DAC 15, the analog audio signal is directed toward an electro-acoustic transducer or transducers, not shown, such as a conventional loudspeaker system.

Referring once again to FIG. 5, it will be appreciated that the error that has occurred during the $t_1-t_2$ period has been compensated for in a manner reminiscent of error compensation of pulse-code modulated signals by interpolation. An insertion of the interpolation datum, [1010] or an integral multiple thereof, between $t_1$ and $t_2$ results in equal densities of 0s and 1s during this time interval. Therefore, viewed in terms of the analog signal as in FIG. 5, the error has been compensated for substantially by insertion of the immediately preceding value. The resulting analog waveform, with the interpolation indicated by the solid line, is analogous with the missing part of the waveform indicated by the broken line. The interpolation datum itself, of which they are an assortment of variants set forth already, is invariably a repetition of 0s and 1s with a repetition frequency that, in terms of an analog equivalent, is higher than the limit of audible of frequencies. Taken by themselves, therefore, the interpolation data according to the invention provide no audible noise at all.

Figure 6:
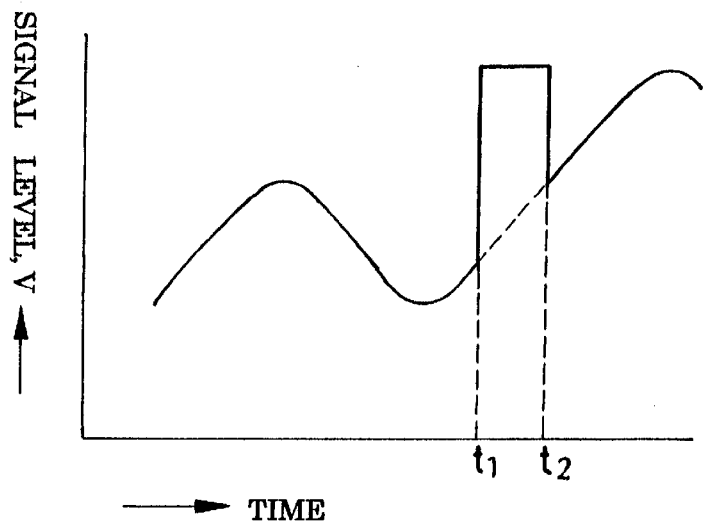
FIG. 6 is a diagram similar to FIG. 5 but explanatory of what would happen should the same error as that of FIG. 5 be compensated for by interpolation of the preceding binary value which in this case is assumed to be 1.

FIG. 6 is explanatory of what would take place should an error in a delta-sigma modulated signal be compensated for by interpolation of the preceding datum, and if this preceding datum happens to be 1. The analog equivalent of the interpolated value would be much higher in magnitude than the neighboring parts of the signal, producing an intolerable noise. The interpolation method according to the invention possesses a pronounced advantage, in terms of noise production, over the interpolation with the preceding value and over the prior art fade-out and -in at each uncorrectable error location.

Notwithstanding the foregoing detailed disclosure it is not desired that the present invention be limited by the exact showing of the drawings or by the description thereof. The following is a brief list of possible modifications or alterations of the illustrated embodiment:

1. The combination of the error-detecting and -correcting circuit 12, interpolation data generator 13, and interpolation circuit 14, all shown in FIG. 3 as applied specifically to an SACD player, could be inserted in any transmission paths of delta-sigma or like pulse-density modulated signals for error compensation.
2. The error-detecting and -correcting circuit 12 is understood to include means for detection of sync and address data, but these circuit means could be external to the circuit 12.
3. The interpolation data generator 13 could be connected to the "uncorrectable" output line 22 of the error-detecting and -correcting circuit 12, as indicated by the dashed line labeled 22$_a$ in FIG. 3, instead of to the "error" output line 21. Interpolation data would then be put out only in the presence of an uncorrectable or uncorrected error. As an additional alternative, the interpolation data generator 13 may constantly put out interpolation data, that is, irrespective of the presence or absence of errors, uncorrectable, uncorrected or otherwise.
4. The invention could be applied to error compensation for data recovered not only from optical disks but from a variety of other storage media such as magnetic disks, both hard and flexible, magnetic tapes, and magneto-optic disks.

What is claimed is:

1. A noise control system for use on a transmission path for a digital signal constituted of primary data in which each sample of an analog signal is expressed by one bit of information, and of error correction data for use in correction of error in the primary data, the noise control system comprising:
   (a) an error-detecting and -correcting circuit for detecting and, if possible, correcting errors in the primary data of the digital signal with use of the error correction data, the error-detecting and -correcting circuit having a first output for delivery of the digital signal, and a second output for production of an uncorrectable error signal indicative of the presence or absence of an uncorrectable or uncorrected error in or from the digital signal;
   (b) an interpolation data generator for generating a predefined interpolation datum for insertion in each uncorrectable or uncorrected error location in the digital signal, the interpolation datum being constituted of a plurality of binary 0s and a plurality of binary 1s, the 0s and 1s in each interpolation datum being equal in number and being so arranged as to represent a frequency in excess of an audible range of frequencies; and
   (c) an interpolation circuit connected to both the error-detecting and -correcting circuit and the interpolation data generator for inserting, when the uncorrectable error signal from the second output of the error-detecting and -correcting circuit indicates the presence of an uncorrectable or uncorrected error, the predefined interpolation datum in the location of the uncorrectable or uncorrected error in the digital signal issuing from the first output of the error-detecting and -correcting circuit.

2. The noise control system of claim 1 wherein the predefined interpolation datum supplied by the interpolation data generator is either [1010]. [0101], [1100], [0011], [0110], [1001], or integral multiples thereof.

3. The noise control system of claim 1 wherein the digital signal is an interleaving of segments each constituted of a first prescribed number of bits, wherein each interpolation datum supplied by the interpolation data generator is constituted of a second prescribed number of bits or of an integral multiple thereof, and wherein the first prescribed number of bits is equal to the second prescribed number of bits or to an integral multiple thereof.

4. The noise control system of claim 1 wherein the interpolation circuit comprises:
   (a) a primary data switch connected to the first output of the error-detecting and -correcting circuit for on-off control of the digital signal according to whether the uncorrectable error signal from the second output of the error-detecting and -correcting circuit indicates the presence or absence of an uncorrectable or uncorrected error; and
   (b) an interpolation data switch connected between the interpolation data generator and an output of the primary data switch and adapted to be turned on and off by the uncorrectable error signal from the second output of the error-detecting and -correcting circuit in inverse relationship to the on-off operation of the primary data switch.

5. A noise control method for a digital signal that is constituted of primary data in which each sample of an analog signal is expressed by one bit of information, and of error correction data for use in correction of error in the primary data, which method comprises:
   (a) detecting error in the digital signal journeying over a transmission path;
   (b) correcting, if possible, an error, if any, in the digital signal with use of the error correction data;
   (c) determining whether or not each error in the digital signal is correctable or has been corrected;
   (d) providing a predefined interpolation datum for insertion in each uncorrectable or uncorrected error location in the digital signal, the interpolation datum being constituted of a plurality of binary 0s and a plurality of binary 1s, the 0s and 1s in each interpolation datum being equal in number and being so arranged as to represent a frequency in excess of an audible range of frequencies; and
   (e) inserting, upon detection of an uncorrectable or uncorrected error in the digital signal, the predefined interpolation datum in the location of the uncorrectable or uncorrected error in the digital signal.

6. The noise control method of claim 5 wherein the predefined interpolation datum is either [1010]. [0101], [1100], [0011], [0110], [1001], or integral multiples thereof.

* * * * *